US009100109B2

United States Patent
Schmidhammer et al.

(10) Patent No.: US 9,100,109 B2
(45) Date of Patent: Aug. 4, 2015

(54) APPARATUS FOR WIRELESSLY TRANSMITTING INFORMATION, COMMUNICATION TERMINAL FOR WIRELESSLY TRANSMITTING INFORMATION AND IMPEDANCE MATCHING METHOD

(75) Inventors: Edgar Schmidhammer, Stein an der Traun (DE); Pasi Tikka, Munich (DE)

(73) Assignee: EPCOS AG, Munich (DE)

( * ) Notice: Subject to any disclaimer, the term of this patent is extended or adjusted under 35 U.S.C. 154(b) by 126 days.

(21) Appl. No.: 13/877,435

(22) PCT Filed: Aug. 29, 2011

(86) PCT No.: PCT/EP2011/064837
§ 371 (c)(1),
(2), (4) Date: Jun. 3, 2013

(87) PCT Pub. No.: WO2012/045526
PCT Pub. Date: Apr. 12, 2012

(65) Prior Publication Data
US 2013/0244589 A1    Sep. 19, 2013

(30) Foreign Application Priority Data
Oct. 4, 2010 (DE) .......................... 10 2010 047 440

(51) Int. Cl.
*H04B 1/44* (2006.01)
*H04B 1/46* (2006.01)
*H04B 15/00* (2006.01)
(Continued)

(52) U.S. Cl.
CPC ................. *H04B 15/00* (2013.01); *H03H 7/40* (2013.01); *H03H 2007/386* (2013.01)

(58) Field of Classification Search
USPC .................. 455/63.1, 67.13, 73, 78, 82, 333; 333/17.3, 101, 109, 124
See application file for complete search history.

(56) References Cited

U.S. PATENT DOCUMENTS

| 5,778,308 A | 7/1998 | Sroka et al. |
| 7,209,727 B2 * | 4/2007 | Castaneda et al. ............... 455/78 |
| 7,468,638 B1 * | 12/2008 | Tsai et al. ....................... 331/126 |

(Continued)

FOREIGN PATENT DOCUMENTS

| EP | 0 685 963 A2 | 12/1995 |
| JP | 8154007 | 6/1996 |

(Continued)

OTHER PUBLICATIONS

"Tuning Solutions," Paratek Adaptive RF, http://www.paratek.com/tuning_solutions.htm, Apr. 6, 2011, 1 page.

(Continued)

*Primary Examiner* — Quochien B Vuong
(74) *Attorney, Agent, or Firm* — Slater & Matsil, L.L.P.

(57) ABSTRACT

An apparatus for wirelessly transmitting information includes a transmitting/receiving unit and an antenna unit. An electrical signal path is between the transmitting/receiving unit and the antenna unit. A front-end module contains at least one duplexer and is electrically connected into the signal path between the transmitting/receiving unit and the antenna unit. A detector unit is used for detecting signals proportional to radio-frequency signals propagating in the signal path. The detector unit is electrically coupled to the signal path between the transmitting/receiving unit and the front-end module.

6 Claims, 3 Drawing Sheets

(51) Int. Cl.
*H03H 7/40* (2006.01)
*H03H 7/38* (2006.01)

(56) References Cited

U.S. PATENT DOCUMENTS

| | | | |
|---|---|---|---|
| 7,865,149 B2 * | 1/2011 | Han et al. | 455/73 |
| 8,022,786 B2 * | 9/2011 | Lee | 333/101 |
| 8,131,232 B2 * | 3/2012 | Muhammad | 455/114.2 |
| 8,320,850 B1 * | 11/2012 | Khlat | 455/107 |
| 8,712,348 B2 * | 4/2014 | Brobston et al. | 455/121 |
| 2003/0076168 A1 | 4/2003 | Forrester | |
| 2006/0025088 A1 | 2/2006 | Pietig et al. | |
| 2007/0194859 A1 | 8/2007 | Brobston et al. | |
| 2010/0222016 A1 | 9/2010 | Kishigami et al. | |
| 2011/0298685 A1 | 12/2011 | Schmidhammer | |

FOREIGN PATENT DOCUMENTS

| | | |
|---|---|---|
| JP | 2005534224 A | 11/2005 |
| JP | 201087845 A | 4/2010 |
| JP | 2010206377 A | 9/2010 |
| WO | 2004010595 A1 | 1/2004 |
| WO | 2010081635 A1 | 7/2010 |

OTHER PUBLICATIONS

"Adaptive Impedance Matching Modules," Paratek Adaptive RF, http://www.paratek.com/aimm.html, Apr. 6, 2011, 2 pages.

* cited by examiner

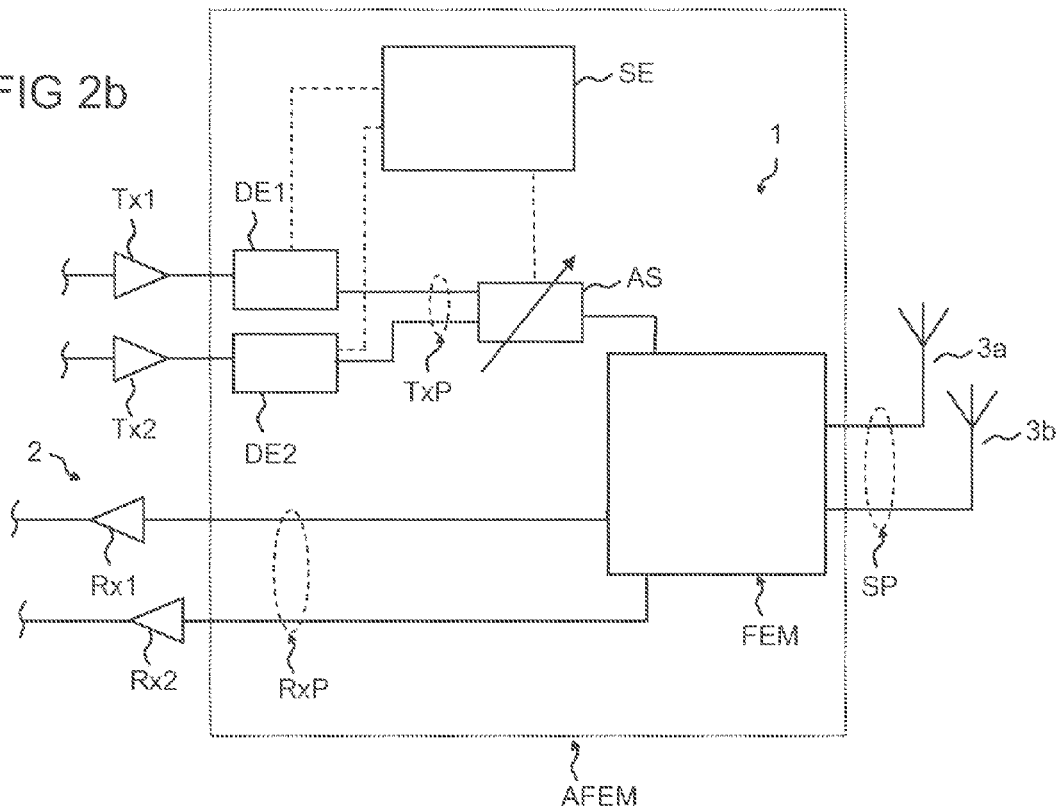

APPARATUS FOR WIRELESSLY TRANSMITTING INFORMATION, COMMUNICATION TERMINAL FOR WIRELESSLY TRANSMITTING INFORMATION AND IMPEDANCE MATCHING METHOD

This patent application is a national phase filing under section 371 of PCT/EP2011/064837, filed Aug. 29, 2011, which claims the priority of German patent application 10 2010 047 440.1, filed Oct. 4, 2010, each of which is incorporated herein by reference in its entirety.

TECHNICAL FIELD

The invention relates to an apparatus for wireless information transmission which has a transmission/reception unit and an antenna unit. In addition, the invention relates to a communication terminal for wireless information transmission which has an appropriate apparatus. Furthermore, the invention relates to a method for impedance matching between a transmission/reception unit and an antenna unit of an apparatus for wireless information transmission in transmission and/or reception frequency ranges.

BACKGROUND

The antenna units of communication terminals, particularly antenna units having planar antennas, react to an alteration in their environment by altering their impedance. A discrepancy in the impedance of an antenna unit from a prescribed characteristic impedance value, for example, 50 Ω, in a signal path between the antenna unit and a transmission/reception unit results in the possibility of power losses occurring as a result of reflection of some of the radio-frequency signals propagating in the signal path. Hence, only a portion of the signal power of transmission signals reaches the antenna unit for radiation into free space. In addition, only a portion of the signal power of received signals reaches the receiver.

Component parts and functional units which are electrically arranged in the signal path between the transmission/reception unit and the antenna unit also have separate frequency-dependent impedance and can cause reflections of propagating radio-frequency signals if their impedance differs from the prescribed impedance value. By way of example, an apparatus for wireless information transmission has not only a transmission/reception unit and an antenna unit but also a front end module having at least one duplexer, which is electrically connected in the signal path between the transmission/reception unit and the antenna unit. The duplexer is a necessary functional unit which serves as a frequency filter or filter for propagating radio-frequency signals—possibly at different frequencies—and separates received signals propagating between the antenna unit and the transmission/reception unit, in particular, from transmission signals propagating between the transmission/reception unit and the antenna unit. The duplexer is constructed from electronic components and therefore has a separate frequency-dependent impedance. For different frequency ranges, it is also possible for a plurality of duplexers to be combined in one complex front end module, with the individual duplexers being selected by means of switches, for example.

In order to avoid reflections and hence power losses in the signal path, it is therefore desirable to attain the most uniform impedance possible that has the prescribed impedance value within the signal path. This is achieved by matching the impedances of the antenna unit and of the transmission/reception unit to one another. This can be accomplished by what are known as matching circuits or networks, which connect tunable impedance elements in order to alter the impedance of the signal path and tune it to the prescribed impedance value.

There are already solutions for sensing the signal power of propagating radio-frequency signals in the signal path and using this to determine a power loss which occurs as a result of reflection. This power loss is finally a measure of the mismatch between the antenna unit and the transmission/reception unit and is used for impedance or power matching in the signal path. This means that on the basis of the measured power loss the impedance in the signal path is altered by a matching circuit until the power loss is reduced.

The possible influences of component parts and functional units on the total impedance in the signal path, and hence on the possible reflection of propagating radio-frequency signals, as a result of the separate frequency-dependent impedance of said component parts and functional units mean that precise and meaningful sensing of power losses and hence adequate impedance matching are very difficult.

SUMMARY OF THE INVENTION

Embodiments provide an apparatus for wireless information transmission, a communication terminal having such an apparatus and a method for impedance matching which are able to improve the sensing of power losses and also the impedance matching in the signal path.

A first aspect provides an apparatus for wireless information transmission, having a transmission/reception unit, an antenna unit, an electrical signal path between the transmission/reception unit and the antenna unit. A front end module contains at least one duplexer and is electrically connected in the signal path between the transmission/reception unit and the antenna unit. A detector unit senses signals in proportion to radio-frequency signals propagating in the signal path. The detector unit is electrically coupled to the signal path between the transmission/reception unit and the front end module.

The detector unit senses signals which allow evaluation of the power difference between an incoming and a reflected electromagnetic wave of a radio-frequency signal. Hence, it is possible to determine the degree of reflections occurring and hence the level of the mismatch between the antenna unit and the transmission/reception unit of the apparatus. The advantage of the positioning of the detector unit between the transmission/reception unit and the front end module is that the detector unit is placed directly downstream of the transmission/reception unit in the direction of the antenna unit, as a result of which it is possible to sense possible power losses on all component parts and functional units in the signal path between the transmission/reception unit and the antenna unit. Hence, it is also possible to sense reflections and power losses from propagating radio-frequency signals which may arise in the front end module, particularly in the duplexer thereof, if the impedance of the duplexer is mismatched for a characteristic frequency of the propagating radio-frequency signals.

The detector unit first of all senses the signal power of an electromagnetic wave moving away from the transmission/reception unit in the direction of the antenna unit and simultaneously—or possibly at an interval of time—senses the signal power of an electromagnetic wave that is reflected by the antenna unit or by further component parts and functional units in the signal path and that returns in the direction of the transmission/reception unit. The ratio of the two signal powers of the outgoing and reflected waves gives what is known as the standing wave ratio (VSWR=voltage standing wave ratio). This is a measure of the power losses in the signal path. If the standing wave ratio is 1, no kind of reflection is occurring, with full transmission of electromagnetic signals being obtained. This is the ideal case. In the real case, the standing wave ratio is greater than 1, a standing wave ratio of approximately 2 usually signifying good power matching and only low reflection, whereas a standing wave ratio of greater than 5, for example, describes a poor signal power with a high level of reflection in the signal path. When the signal path is open or shorted, the standing wave ratio is mathematically drawn towards infinity.

The explained positioning of the detector unit allows the level of the mismatch to be sensed more realistically, with the result that impedance matching by a matching circuit can be improved. Hence, the total gain of propagating radio-frequency signals and finally the signal quality of these signals can be increased.

Preferably, the transmission/reception unit comprises a transmitter and a receiver, wherein the signal path between the transmitter and the front end module comprises a transmission path for sending radio-frequency signals and the signal path between the receiver and the front end module comprises a reception path for receiving radio-frequency signals. In particular, the transmitter comprises a power amplifier (PA) for generating a transmission signal at an appropriate transmission power. A fraction of this transmission power is finally radiated to the outside into free space via the antenna unit. In particular, the receiver comprises a low noise amplifier (LNA) for amplifying extremely weak received signals which are received from free space by the antenna unit.

Transmission signals and received signals may have frequencies in a uniform frequency range (frequency band). This is used in what is known as time division duplexing (TDD), for example. This involves transmission signals and received signals being separated from one another in time and being transmitted at a time offset in prescribed time windows in a short sequence. However, it is also possible to set up different transmission and reception frequency ranges (transmission bands and reception bands). This is used in what is known as frequency division duplexing (FDD), for example.

A combination of FDD methods and TDD methods is used in what is known as the UMTS standard (UMTS=Universal Mobile Telecommunications System) or in the GSM standard (GSM=Global System for Mobile Communications), for example. Transmission signals are transmitted in transmission frequency ranges (what are known as "uplink" frequencies), whereas received signals are transmitted in reception frequency ranges (what are known as "downlink" frequencies). The frequency ranges are additionally separated from one another by a characteristic band interval in the frequency range.

In the case of such standards, impedance matching therefore needs to be used for matching in a plurality of frequency ranges of the transmission and reception frequencies at the same time. A front end module is designed for different frequency ranges of transmission signals and received signals, for example, in the form of a plurality of duplexers in a filter bank which are selected by means of switches, with the result that it is possible to perform frequency-dependent separation and filtering of transmission signals and received signals.

Preferably, the detector unit is electrically coupled to the transmission path between the transmitter and the front end module. This means that signals can be sensed for the purpose of evaluating the mismatch in the transmission path. Hence, impedance matching in the transmission path is possible, as a result of which the signal quality of the transmission signals can be increased and at the same time the transmission signal power in the power amplifier of the transmitter can be reduced. This results in a reduction in the power consumption in the power amplifier.

A further advantage of setting up the detector unit in the transmission path is that it is possible to use sensors for the detector unit which are used for measuring current, voltage or power in the power amplifier anyway. These can be integrated into the detector unit, with the result that no or only a few additional sensors or measuring means need to be used for detecting the power values of propagating radio-frequency signals. This allows a reduction in cost and effort.

Preferably, the apparatus has a matching circuit which has at least one tunable impedance element and is electrically connected in the signal path between the transmission/reception unit and the antenna unit for the purpose of impedance matching in transmission and/or reception frequency ranges. Such a matching circuit can be used to implement the matching of the impedance between the transmission/reception unit and the antenna unit on a frequency basis for transmission/reception frequency ranges. One or more tunable impedance elements of the matching circuit can be used to set a prescribed characteristic impedance value for the signal path. By way of example, this characteristic impedance value is prescribed by the transmission/reception unit and/or by the electrical lines in the signal path. In mobile radio, this characteristic impedance value may be a value of 50 $\Omega$, for example. Other impedance values are also conceivable, however.

The tuning, that is to say the setting of one or more impedance elements in the matching circuit, can take place manually or in automated fashion. By way of example, manual tuning is used for a manual channel search. Automated tuning is advantageous particularly when impedance matching needs to be automatically readjusted by altering external environmental influences.

By using the matching circuit, the impedance in the signal path is matched such that reflection losses in the signal path can be minimized. At the same time, this maximizes the transmission of transmission signals to the antenna unit and of received signals to the receiver.

A further advantage of the matching circuit is that with appropriate design and complexity it can set and match almost any conceivable impedance value. By interacting with the positioning of the detector unit between the transmission/reception unit and the front end module, particularly in the transmission path, it is also possible, as already explained, to take account of a mismatch in the at least one duplexer in the front end module. The matching circuit can therefore also be used to tune the impedance of the duplexer in the signal path. This means that the duplexer must not necessarily be preset to a characteristic impedance value or dogmatically trimmed thereto. On the contrary, unrestricted design of the duplexer independently of the output impedance thereof is possible or even desirable. The reason is that this means an additional degree of freedom for setting an improved performance characteristic and improved filter properties. Particularly what is known as the roll-off factor, which substantially influences the gradient of the transfer characteristic of a filter in the frequency domain, can be designed without restriction. This allows the properties of the at least one duplexer and hence of the front end module to be matched to the transmission or reception frequency ranges used and the signal powers that are to be attained for the transmission signals and received signals. It is thus possible for the duplexer and the whole front end module to be of very low noise design, for example.

According to one embodiment of the apparatus, the matching circuit is electrically connected in the transmission path between the transmitter and the front end module. Advantageously, the matching circuit is connected between the detector unit and the front end module in this case, with the result that the detector unit can also sense reflection and transmission on the matching circuit. This embodiment has the advantage that impedance matching is performed only for frequencies in the transmission frequency range for transmission signals in the transmission path. The impedance of the component parts in the signal path for frequencies in the reception frequency range of received signals in the reception path is not altered. Hence, no additional discrepancy in the impedance for frequencies in the reception frequency range from a prescribed impedance value arises either. In the case of transmission methods with different transmission/reception frequency ranges, this has the advantage that the signal power of the received signals is not impaired.

In another embodiment of the apparatus, the matching circuit is electrically connected in the signal path between the front end module and the antenna unit. By way of example, this embodiment is conceivable if the transmission and reception frequency ranges are uniform. Thus, this embodiment of the apparatus is conceivable for standards which use time division duplexing at a uniform frequency, for example. Impedance matching then takes place uniformly in one frequency range both for transmission signals and for received signals, with the result that the signal powers of the transmission signals and received signals can also be optimized in uniform fashion. However, it is also conceivable for this embodiment to be used for radio standards which use time division duplexing with different frequency ranges for transmission signals and received signals. In this case, the frequency of the transmission signal is transmitted in one time window and the frequency of the received signal is transmitted in another time window. Impedance matching by the matching circuit can then be performed in the first time window for the transmission frequency range and, if appropriate, in the second time window for the reception frequency range.

Preferably, the matching circuit in the latter embodiment is set up such that the matching in at least one transmission frequency range and the matching in at least one reception frequency range can be performed simultaneously. The matching circuit has a response which has an optimum both in the transmission frequency range and in the reception frequency range, which is different than the latter. Hence, the matching circuit can set the impedance in the signal path in optimum fashion both for a transmission frequency range and for a reception frequency range. Such a response from the matching circuit is also called a "double notch tuner topology."

This avoids the conventional problem already cited that, when matching the impedance for the transmission frequency range to a prescribed impedance value, for example, a distinct discrepancy in the impedance in the reception frequency range from the prescribed impedance value occurs, with the result that the signal power of the reception frequency range is lowered by a distinct mismatch. In conventional matching circuits, there was the problem of the reception signal quality being impaired when matching the transmission signal quality. In the case of a matching circuit as explained above, however, it is possible to compensate for different frequency-dependent impedances, for example, in the front end module, for different frequencies from transmission and reception frequency ranges. Hence, for both ranges, it is possible to attain impedance values in the signal path which are matched to a uniform and characteristic impedance value. This allows optimum matching both of a transmission path and of a reception path and makes it possible to avoid reflections and power losses in both signal paths.

Preferably, the apparatus has a control unit which is electrically connected to the detector unit and to the matching circuit and is set up to take the signals sensed by the detector unit as a basis for altering the impedance of the matching circuit. The use of a control unit has the advantage that impedance matching can be performed in automated fashion. In this case, the control unit comprises logic circuits which implement the actuation of the matching circuit, particularly the tuning of one or more impedance elements in the matching circuit. Hence, particularly alterations in the antenna impedance of the antenna unit can be adjusted automatically. Such alterations in the antenna impedance arise, as explained at the outset, as a result of alteration in the ambient conditions, for example. The use of the control unit allows a fast and efficient reaction to such alterations in the ambient conditions. In addition, a wide variety of transmission methods—time division duplexing or frequency division duplexing—can be implemented quickly in the apparatus, since the control unit allows programming for a respective transmission method. If changeover between time division duplexing and frequency division duplexing or hybrid mode is implemented, for example, then the control unit can actuate the matching circuit in automated fashion as appropriate.

Preferably, the detector unit comprises at least one directional coupler. In this case, the directional coupler is set up to sense direction-dependent signals in proportion to the propagating radio-frequency signals in the signal path. In this case, measurement of current, voltage or power and phase measurement of the propagating radio-frequency signals are possible. The directional coupler implements a measuring unit which is set up to sense a standing wave ratio, for example. Advantageously, the directional coupler is set up to operate in one frequency range or in a plurality of frequency ranges.

A second aspect describes a communication terminal for wireless information transmission which has an apparatus of the cited type. By way of example, the communication terminal may comprise a mobile radio, a pocket PC, a PDA (personal digital assistant) or generally a PC with an interface for a wireless network. The apparatus of the cited type allows the signal quality of the wireless information transmission to be increased, with the transmission signal power in the power amplifier of the apparatus being able to be reduced. This results in a reduction in the current consumption and also in a reduction in the energy consumption. Particularly in the case of mobile communication terminals having a storage battery or a battery, this advantageously increases the storage battery or battery operating time. Besides an increase in the signal quality, the energy efficiency is therefore also increased. Further advantages of an apparatus of the aforementioned type are obtained accordingly when the apparatus is used in the communication terminal.

A further aspect provides a method for impedance matching between a transmission/reception unit and an antenna unit of an apparatus for wireless information transmission in transmission and/or reception frequencies. The apparatus has a detector unit and a matching circuit. The method has the following steps. Signals are generated and sensed in proportion to radio-frequency signals propagating in a signal path between the transmission/reception unit and the antenna unit by the detector unit which is arranged between the transmission/reception unit and a front end module of the apparatus. Impedance values for the matching circuit are determined and set on the basis of the sensed signals.

Such a method allows improved sensing of power losses from propagating radio-frequency signals in the signal path between the transmission/reception unit and the antenna unit which arise as a result of reflection on component parts and functional units which have a mismatch in their impedance. Frequency-dependent impedance values can be set by evaluating programmed table entries (look-up table), for example.

The matching circuit can then be actuated such that an impedance value for the matching circuit is set which adjusts the total impedance in the signal path such that the signal path is brought into line with a prescribed characteristic impedance value. Hence, it is possible to reduce reflections and power losses. This optimizes the signal quality. The interplay between the detector unit and position thereof and the actuation of the matching circuit makes it possible to attain fast and efficient matching of the transmission and reception properties of the apparatus for wireless information transmission as a reaction to alterations in ambient conditions.

In particular, the detector unit evaluates at least one of the following variables in the overall signal path between the transmission/reception unit and the antenna unit: impedance, admittance, standing wave ratio and reflection coefficient. The evaluation of one or of a combination of said variables allows a statement about the power losses in the signal path. Depending on the evaluated variable, it is possible to make appropriate settings in the matching circuit.

Preferably, the method has a control unit provided, wherein the matching circuit comprises at least one tunable impedance element in which the impedance value required for impedance matching is automatically ascertained and set by the control unit during the method.

In this case, the control unit advantageously operates in the manner already explained. Hence, the method has the assurance of fast and automated matching of the impedance.

BRIEF DESCRIPTION OF THE DRAWINGS

The invention is explained below using a plurality of exemplary embodiments with reference to drawings, in which:

FIG. 2b shows a third embodiment of an apparatus for wireless information transmission;

DETAILED DESCRIPTION OF ILLUSTRATIVE EMBODIMENTS

Figure 1:
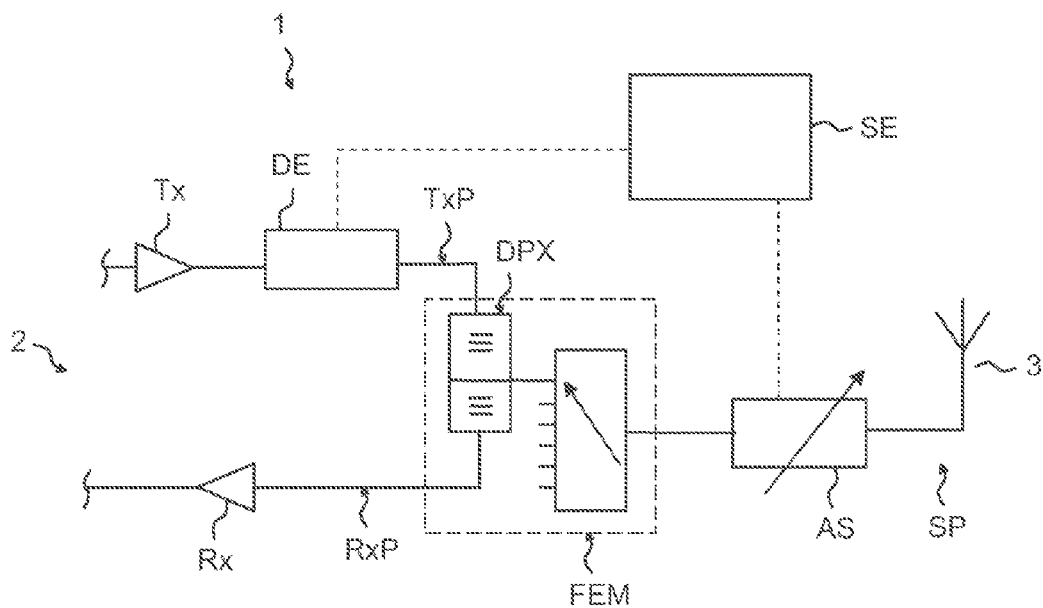
FIG. 1 shows a first embodiment of an apparatus for wireless information transmission.

FIG. 1 shows a first embodiment of an apparatus 1 for wireless information transmission. The apparatus 1 has a transmission/reception unit 2 and also an antenna unit 3. The transmission/reception unit 2 is connected to the antenna unit 3 via a signal path SP. Within the signal path SP, it is possible for electromagnetic waves of propagating radio-frequency signals to run from the transmission/reception unit 2 to the antenna unit 3 and conversely from the antenna unit 3 to the transmission/reception unit 2. In particular, the transmission/reception unit 2 has a transmitter Tx for generating transmission signals and a receiver Rx for receiving received signals.

The transmitter Tx comprises a power amplifier (not shown explicitly) which amplifies a transmission signal such that the transmission signal is transmitted at a particular transmission signal power to the antenna unit 3, where a fraction of the transmission signal power is radiated into free space.

The receiver Rx has a low noise amplifier (not shown explicitly) which amplifies extremely weak received signals, in particular, which are received from free space by the antenna unit 3. The signal path SP is separated into a transmission path TxP in the direction of the transmitter Tx and into a reception path RxP in the direction of the receiver Rx. The separation is implemented electrically by means of a front end module FEM with at least one duplexer DPX, which is electrically connected in the signal path SP.

By way of example, the front end module FEM or the duplexer DPX comprises a frequency filter or a specially designed and set-up filter for separating transmission signals and received signals. Transmission signals are introduced into the signal path SP by the transmitter Tx via the transmission path TxP and the duplexer DPX and reach the antenna unit 3. Conversely, the antenna unit 3 receives received signals which are introduced into the reception path RxP via the signal path SP and the duplexer DPX and reach the receiver Rx. Transmission signals and received signals may have a uniform frequency range or different frequency ranges. It is also conceivable to provide a plurality of transmission channels and, in parallel, a plurality of reception channels, with a channel respectively comprising a characteristic frequency range and the channels being divided by prescribed band intervals in the frequency range. When different transmission and reception frequency ranges are used, the front end module FEM comprises a filter bank, in particular, comprising a plurality of filters which each operate as a duplexer DPX, a filter being set up to filter passing radio-frequency signals on the basis of a prescribed characteristic transmission or reception frequency in each case.

The transmission path TxP has a detector unit DE electrically coupled to it. The detector unit DE has one or more sensors which are set up to sense signals in proportion to the radio-frequency signals propagating in the transmission path TxP and the signal path SP. By way of example, the sensors may each comprise one or more directional couplers.

In particular, the detector unit DE is set up to sense the power of an electromagnetic wave moving from the transmitter Tx to the antenna unit 3 on the basis of direction and the power of an electromagnetic wave reflected from the antenna unit 3 to the transmitter Tx, likewise on the basis of direction. From the two sensed power values, it is possible to determine the standing wave ratio (VSWR=voltage standing wave ratio) described at the outset.

Reflected waves which return to the transmitter Tx arise particularly because functional units, such as the duplexer DPX of the front end module FEM or the signal path SP, have an impedance which is different than a prescribed characteristic impedance value. In the case of mobile radio systems, the prescribed characteristic impedance value is 50 $\Omega$, for example. However, any other values are also conceivable. Hence, if impedance differences occur in the signal path SP, including the transmission path TxP between the transmitter Tx and the antenna unit 3, then reflection is produced at that point, and hence a power loss in the signal power of the propagating radio-frequency signal. The same result is obtained for signals in the signal path SP, including the reception path RxP between the antenna unit 3 and the receiver Rx.

In order to match the impedance of the signal path SP between the transmitter Tx and the antenna unit 3, the apparatus 1 has a matching circuit AS which is electrically connected in the signal path SP between the duplexer DPX and the antenna unit 3. The matching circuit AS has at least one tunable impedance element, with the result that the impedance of the matching circuit AS can be altered. This means that the matching circuit AS can be used to set a frequency-dependent impedance value which is connected in series with the impedance values of the remainder of the component parts and functional units in the signal path SP, and hence a total impedance which has the desired characteristic impedance value can be achieved in the signal path SP.

The matching circuit AS can therefore be used to match the total impedance, with the result that it is possible to minimize reflections of electromagnetic waves in the signal path SP. If the impedance of the front end module FEM, particularly of the duplexer DPX, differs from the characteristic impedance value for a particular frequency, for example, then it is possible to use an adjustable impedance value for the matching circuit AS to compensate for this mismatch of the duplexer DPX, the characteristic impedance value being adjustable. Electromagnetic waves which pass through the duplexer DPX from the transmitter Tx to the antenna unit 3, or electromagnetic waves which pass from the antenna unit 3 through the duplexer DPX to the receiver Rx, are now reflected in the duplexer DPX only very slightly or ideally not at all. Hence, it is possible to attain an improvement in the signal quality of transmission signals and received signals.

The positioning of the detector unit DE in the transmission path TxP directly in the direction of the antenna unit 3 downstream of the transmitter Tx allows all mismatches in the signal path SP to be sensed by the detector unit DE. Hence, besides mismatches in the antenna unit 3 or in electrical lines in the signal path SP, it is also possible to sense mismatches in the front end module FEM or in the duplexer DPX which are able to be compensated for by means of the matching circuit AS.

Furthermore, the duplexer DPX can even be consciously designed such that it has a frequency-dependent impedance for frequencies of the transmission signals/received signals which does not have the prescribed characteristic impedance value. The duplexer DPX can be specifically designed such that the filter properties thereof, such as the roll-off factor already explained or the edge gradient of transmitted signals, are optimized.

A further advantage of setting up the detector unit DE directly downstream of the transmitter Tx is that it is possible to use sensors for the detector unit DE which are used for measuring current, voltage or power in the power amplifier of the transmitter Tx anyway.

For the purpose of automated matching of the impedance by the matching circuit AS on the basis of measurement signals from the detector unit DE, a control unit SE is connected both to the detector unit DE and to the matching circuit AS. The connections are shown by means of dashed lines. In particular, the control unit SE comprises logic circuits for sensing signals generated in the detector unit DE, with the control unit SE being able to be used to calculate a standing wave ratio, for example. On the basis of this evaluation, the control unit SE can use further logic circuits to actuate the matching circuit AS and to alter the impedance value of one or more tunable impedance elements in the matching circuit AS such that it is possible to set an impedance for the matching circuit AS and to perform impedance matching for the signal path SP of the cited type.

Automated impedance matching using the control unit SE has the advantage that impedance changes can be equalized quickly and efficiently in the apparatus 1 as a reaction to changes in ambient influences. Furthermore, the control unit SE is programmable, which means that even for different transmission standards which use frequency division duplexing or time division duplexing or a combination thereof, for example, it is possible to match the impedance of the apparatus 1 and to attain an optimum signal quality for any transmission standard.

On the basis of the embodiment in FIG. 1, the matching circuit AS is advantageously designed such that impedance matching can be performed for different transmission and reception frequency ranges. An appropriate design for a matching circuit AS is explained more precisely below.

Figure 2A:
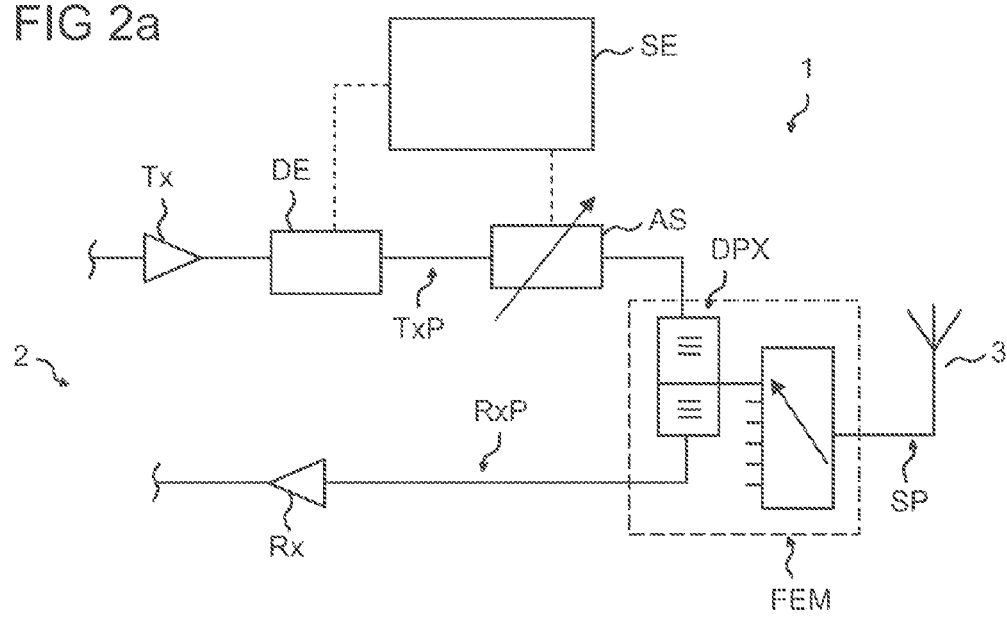
FIG. 2a shows a second embodiment of an apparatus for wireless information transmission.

FIG. 2a shows a second embodiment of an apparatus 1, wherein the matching circuit AS in this embodiment is arranged in the transmission path TxP between the detector unit DE and the front end module FEM. Otherwise, the design of the apparatus 1 corresponds essentially to the design shown in FIG. 1 and has similar functionality. On the basis of the embodiment in FIG. 2a, the arrangement of the matching circuit AS in the transmission path TxP means that it is only possible to match the frequency-dependent impedance for frequencies in the transmission frequency range. The impedance of the signal path SP in reception frequency ranges is not altered. By way of example, this embodiment is advantageous for radio standards in which only the transmission signal power needs to be matched. The reason is that matching the total impedance in the signal path exclusively for transmission signals has the advantage that the signal power of received signals and hence the signal quality in the reception path RxP is not influenced and hence also not impaired by alteration of an impedance in the matching circuit AS.

FIG. 2b shows a third alternative embodiment of an apparatus 1. In this case, two transmitters Tx1 and Tx2 and one detector unit DE1 and DE2 each are provided which have been matched to different transmission frequency ranges. The transmitters Tx1 and Tx2 transmit on different frequencies, with the detector units DE1 and DE2 each sensing the signal power for the respective transmission frequency ranges.

In addition, a plurality of receivers Rx1 and Rx2 are provided which have been matched to different reception frequency ranges. The receivers Rx1 and Rx2 therefore receive different frequencies. Different transmission/reception frequencies are received from free space and radiated into free space by a plurality of antennas 3a and 3b. The antennas 3a, 3b and also the components Tx1 and Tx2 and also Rx1 and Rx2 may also be of redundant design for uniform transmission/reception frequency ranges, however. The manner of operation of the matching circuit AS and of the control unit SE corresponds to the manner of operation from FIG. 2a.

The components DE1, DE2, AS, SE and FEM are integrated in one module, which is a tunable front end module AFEM. The module AFEM can be tuned to different transmission/reception frequency ranges.

Depending on the application and execution of a corresponding radio standard, both the embodiment shown in FIG. 1 and the embodiments shown in FIGS. 2a and 2b for an apparatus 1 for wireless information transmission may be useful and legitimate. A corresponding apparatus 1 is used in mobile radios, smartphones, pocket PCs or PDAs (personal digital assistants) and also generally in computers having an interface for a wireless network, for example. In general, an apparatus 1 may be prepared for any communication terminals which use wireless information transmission.

The frequencies of the GSM system (Global System for Mobile Communication), of the WCDMA system (Wide Code Division Multiple Access) and more generally the frequencies of FDD systems or TDD systems are the preferred frequencies which are used when an apparatus 1 as described is employed.

Particular preference is accorded to the following frequency pairs:
transmission frequency range: 1920-1980 MHz and reception frequency range: 2110-2170 MHz,
transmission frequency range: 1850-1910 MHz and reception frequency range: 1930-1990 MHz,
transmission frequency range: 1710-1785 MHz and reception frequency range: 1805-1880 MHz,
transmission frequency range: 1710-1755 MHz and reception frequency range: 2110-2155 MHz,
transmission frequency range: 824-849 MHz and reception frequency range: 869-894 MHz,
transmission frequency range: 830-840 MHz and reception frequency range: 875-885 MHz,
transmission frequency range: 2500-2570 MHz and reception frequency range: 2620-2690 MHz,
transmission frequency range: 880-915 MHz and reception frequency range: 925-960 MHz,
transmission frequency range: 1750-1785 MHz and reception frequency range: 1845-1880 MHz,
transmission frequency range: 1710-1770 MHz and reception frequency range: 2110-2170 MHz,
transmission frequency range: 1428-1453 MHz and reception frequency range: 1476-1501 MHz,
transmission frequency range: 698-716 MHz and reception frequency range: 728-746 MHz.

The text below explains the manner of operation of a matching circuit AS and particularly the use thereof in an embodiment as shown in FIG. 1.

Figure 3:
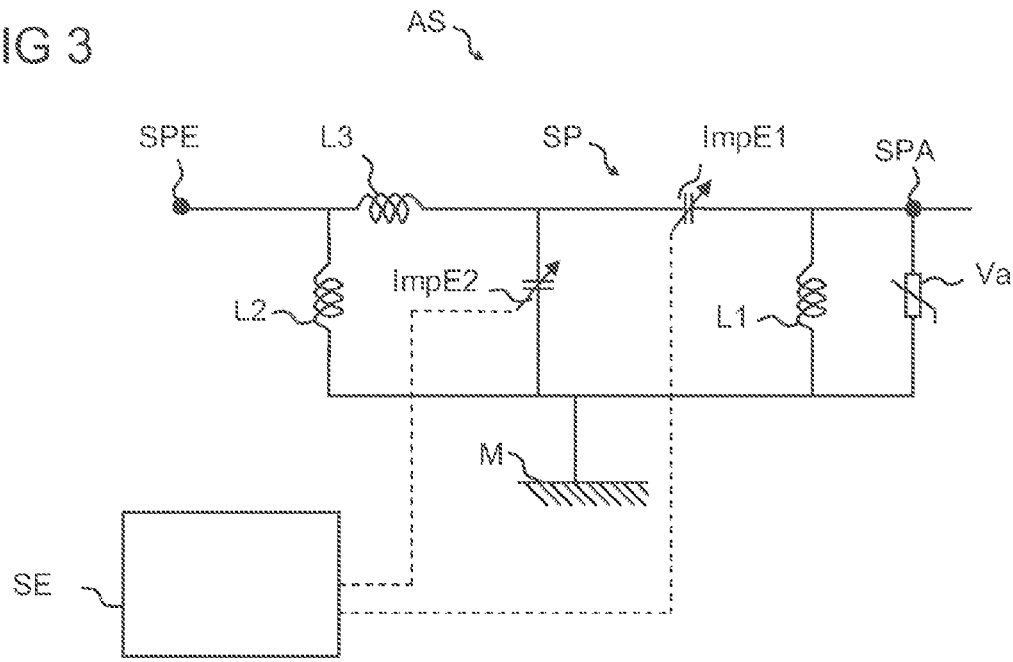
FIG. 3 shows an exemplary embodiment of a matching circuit.

FIG. 3 illustrates a matching circuit AS which allows wideband impedance matching both for the transmission frequency range and for the reception frequency range at the same time. A signal path input SPE and a signal path output SPA have a first impedance element ImpE1 with adjustable impedance connected between them in a signal path SP. The signal path SP and ground M—in this case the signal path input SPE and ground M—have a second impedance element ImpE2 with adjustable impedance connected between them. The signal path output SPA and ground M have a first inductive element L1 connected between them. In addition, the signal path SPE and ground M have a second inductive element L2 connected between them. Furthermore, the signal path output SPA and ground M have an element with a voltage-dependent resistance Va connected between them. Harmful interference signals, such as ESD pulses, which could penetrate the matching circuit via an antenna supply line A1 to which the antenna is connected, can be discharged to ground M via the second inductive element L2 or via the element of variable voltage-dependent resistance Va.

Furthermore, FIG. 3 shows an embodiment in which the signal path SP contains a third inductive element L3 connected between the signal path input SPE and the first impedance element ImpE1. The connection of the inductive elements may be more or less advantageous depending on the frequency range and antenna geometry. Accordingly, it is possible to connect only one, only two or three impedance elements.

FIG. 3 shows the impedance elements by way of example as adjustable capacitive elements. Alternatively, adjustable inductive elements may also be connected. It is also possible for a combination of adjustable capacitive elements and adjustable inductive elements to be connected.

In addition, the matching circuit AS is connected to a control unit SE, which is a microcontroller, for example, and is connected to the first and second impedance elements ImpE1 and ImpE2 of variable impedance. The control unit SE has the logic integrated in it, said logic taking the instantaneous impedance matching and evaluation of power losses by the detector unit DE shown in FIG. 1 or FIG. 2a as a basis for ascertaining a new set of impedance values and setting the adjustable impedance elements ImpE1 and ImpE2 accordingly.

Figure 4:
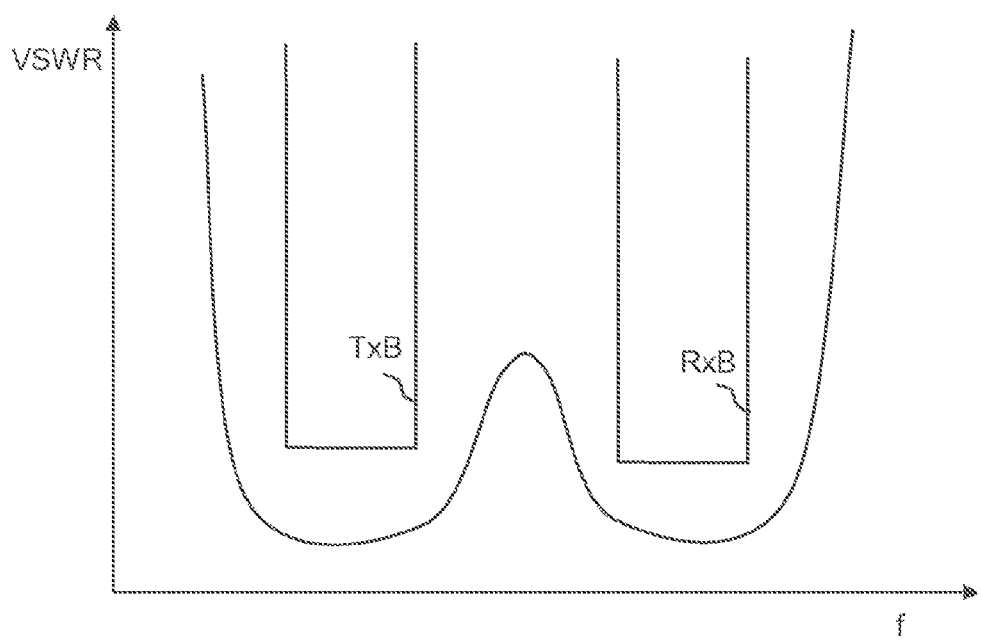
FIG. 4 shows the profile of the standing wave ratio over frequency for matched transmission and reception frequency ranges from the matching circuit shown in FIG. 3.

FIG. 4 provides an exemplary illustration of the profile of the frequency-dependent standing wave ratio VSWR over frequency f, which is intended to serve as an information source for the present impedance matching. In the illustration shown, the frequency f increases toward the right. The matching circuit AS available is a matching network of the type explained which has two matching points at which the matching to transmission and reception frequency ranges TxB and RxB is optimum. A matching circuit AS having such a transfer characteristic in the frequency domain is also called a "double notch tuner topology."

As shown in FIG. 4, the matching circuit AS has been set such that the two minima of the matching points each correspond to the frequency ranges of the transmission band TxB and the reception band RxB. This means that at the relevant minima the standing wave ratio is sufficiently small and an optimum signal quality has been attained by virtue of appropriately tuned impedance values for the impedance elements ImpE1 and ImpE2.

The embodiments shown are chosen merely by way of example. The configuration of the functional units shown may differ from the embodiments shown if required, depending on the embodiment of an apparatus 1, without restricting the manner of operation and the advantages explained.

It is conceivable for a transmitter Tx to have a plurality of individual transmitters Tx1, Tx2, . . . which have been matched to different transmission frequency ranges. In addition, it is conceivable for a receiver Rx to have a plurality of individual receivers Rx1, Rx2, . . . which have been matched to different reception frequency ranges. An antenna unit 3 may also have a plurality of antennas 3a, 3b, . . . which have been tuned to different transmission/reception frequency ranges.

In addition, it is conceivable for a matching circuit AS and also a detector unit DE to be designed such that they have been matched to different transmission/reception frequency ranges. In this case, the components AS and DE may also each be constructed from a plurality of individual components.

A front end module FEM of the type described may have one or more duplexers which have been matched to different transmission/reception frequency ranges. In the case of a complex front end module FEM having a plurality of duplexers, the latter are selected by means of switches, for example.

The front end module FEM, the detector unit DE, the matching circuit AS and also the control unit SE may be integrated in one module, which is a tunable front end module AFEM.

The invention claimed is:

1. An apparatus for wireless information transmission, the apparatus comprising:
a transmission/reception unit comprising a transmitter and a receiver;
an antenna terminal;
an electrical signal path between the transmission/reception unit and the antenna terminal;
a front end module comprising a duplexer, the front end module being electrically connected in the signal path between the transmission/reception unit and the antenna terminal and wherein the signal path between the transmitter and the front end module comprises a transmission path for sending radio-frequency signals and the signal path between the receiver and the front end module comprises a reception path for receiving radio-frequency signals;

a detector unit electrically coupled to the transmission path between the transmitter and the front end module and configured to sense signals in proportion to radio-frequency signals propagating in the signal path;

an antenna unit coupled to the antenna terminal, the antenna unit comprising an antenna;

a matching circuit that has at least one first tunable impedance element and is electrically connected in the signal path between the front end module and the antenna terminal for the purpose of impedance matching in transmission and/or reception frequency ranges; and a control unit electrically connected to the detector unit and to the matching circuit, the control unit configured to take the signals sensed by the detector unit as a basis for altering the impedance of the matching circuit;

wherein the matching circuit comprises:
- a matching circuit signal path with a signal path input and a signal path output, wherein the at least one first tunable impedance element is electrically connected in the matching signal path;
- a second tunable impedance element electrically connected between the signal path input and a ground;
- a first inductive element electrically connected between the signal path output and the ground;
- a second inductive element electrically connected between the signal path input and the ground; and
- a voltage-dependent variable resistance element electrically connected between the signal path output and the ground; and wherein voltage-dependent variable resistance element and the second inductive element are arranged such that harmful interference signals entering the matching circuit via the antenna terminal are discharged to the ground via the second inductive element or via the voltage-dependent variable resistance element.

2. The apparatus according to claim 1, wherein the matching circuit is set up such that the matching in at least one transmission frequency range and the matching in at least one reception frequency range can be performed simultaneously.

3. The apparatus according to claim 1, wherein the front end module, the detector unit, the matching circuit and the control unit are integrated in a single module and the module is a tunable front end module.

4. The apparatus according to claim 1, wherein the detector unit comprises at least one directional coupler.

5. A communication terminal for wireless information transmission, having an apparatus according to claim 1.

6. The apparatus according to claim 1, wherein the matching circuit further comprises a third inductive element electrically connected between the signal path input and the first impedance element.

* * * * *